United States Patent
Kondo et al.

(10) Patent No.: US 8,411,455 B2
(45) Date of Patent: Apr. 2, 2013

(54) MOUNTING STRUCTURE AND MOTOR

(75) Inventors: Kenji Kondo, Nara (JP); Masahito Hidaka, Osaka (JP); Koji Kuyama, Hyogo (JP); Yutaka Kamogi, Osaka (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 12/808,948

(22) PCT Filed: Feb. 22, 2010

(86) PCT No.: PCT/JP2010/001139
§ 371 (c)(1),
(2), (4) Date: Jun. 17, 2010

(87) PCT Pub. No.: WO2010/100855
PCT Pub. Date: Sep. 10, 2010

(65) Prior Publication Data
US 2011/0050051 A1    Mar. 3, 2011

(30) Foreign Application Priority Data
Mar. 4, 2009   (JP) ................................ 2009-050967

(51) Int. Cl.
*H05K 7/10*   (2006.01)
(52) U.S. Cl. ........ 361/767; 361/768; 174/257; 174/262; 428/114; 428/198; 428/210; 428/615; 257/200; 257/668; 257/779; 228/207; 228/223; 420/560; 420/561; 420/562; 430/280.1; 438/622
(58) Field of Classification Search .................. 361/767, 361/768; 174/262, 257; 428/114, 198, 210, 428/615; 257/200, 668, 779; 228/207, 223; 420/560–562; 430/280.1; 438/622
See application file for complete search history.

(56) References Cited

U.S. PATENT DOCUMENTS

| | | | | | |
|---|---|---|---|---|---|
| 5,268,255 | A | * | 12/1993 | Kikuchi et al. ............. | 430/280.1 |
| 5,527,628 | A | * | 6/1996 | Anderson et al. ............. | 428/647 |
| 5,658,528 | A | * | 8/1997 | Ninomiya et al. ............. | 420/562 |
| 5,677,045 | A | * | 10/1997 | Nagai et al. .................. | 442/294 |
| 5,972,562 | A | * | 10/1999 | Tani et al. .................. | 430/280.1 |
| 5,985,212 | A | * | 11/1999 | Hwang et al. ................. | 420/560 |
| 6,033,488 | A | * | 3/2000 | An et al. .......................... | 148/24 |
| 6,104,095 | A | * | 8/2000 | Shin et al. ..................... | 257/787 |
| 6,114,005 | A | * | 9/2000 | Nagai et al. .................. | 428/114 |

(Continued)

FOREIGN PATENT DOCUMENTS

| | | |
|---|---|---|
| JP | 06-283867 | 10/1994 |
| JP | 8-206874 | 8/1996 |

(Continued)

*Primary Examiner* — Xiaoliang Chen
(74) *Attorney, Agent, or Firm* — Hamre, Schumann, Mueller & Larson, P.C.

(57) ABSTRACT

A mounting structure 1 in which an electronic component 5 is surface-mounted with solder 4 to a wiring substrate 2 is disclosed. The solder is Sn—Ag—Bi—In-based solder containing 0.1% by weight or more and 5% by weight or less of Bi, and more than 3% by weight and less than 9% by weight of In, with the balance being made up of Sn, Ag and unavoidable impurities. The wiring substrate has a coefficient of linear expansion of 13 ppm/K or less in all directions. Thus, it is possible to realize a mounting structure using lead-free solder and for which the occurrence of cracks in a solder joint portion due to a 1000-cycle thermal shock test from −40 to 150° C. has been suppressed.

6 Claims, 4 Drawing Sheets

U.S. PATENT DOCUMENTS

| | | | | |
|---|---|---|---|---|
| 6,241,942 | B1* | 6/2001 | Murata et al. | 420/561 |
| 6,334,570 | B1* | 1/2002 | Koshi et al. | 228/180.22 |
| 6,433,425 | B1 | 8/2002 | Sarkhel | |
| 6,555,592 | B2* | 4/2003 | Tseng et al. | 522/39 |
| 7,719,119 | B2* | 5/2010 | Yoshikawa et al. | 257/779 |
| 7,838,954 | B2* | 11/2010 | Buchwalter et al. | 257/437 |
| 2001/0030061 | A1* | 10/2001 | Yoneda | 174/260 |
| 2002/0009384 | A1* | 1/2002 | Habu et al. | 420/557 |
| 2002/0015660 | A1* | 2/2002 | Murata et al. | 420/561 |
| 2002/0106302 | A1* | 8/2002 | Habu et al. | 420/561 |
| 2002/0120031 | A1* | 8/2002 | Chen | 522/168 |
| 2002/0132096 | A1* | 9/2002 | Takeuchi et al. | 428/210 |
| 2002/0147264 | A1* | 10/2002 | Takeuchi et al. | 524/495 |
| 2003/0015575 | A1* | 1/2003 | Yamaguchi et al. | 228/248.1 |
| 2003/0034381 | A1* | 2/2003 | Nakatsuka et al. | 228/180.1 |
| 2003/0070835 | A1* | 4/2003 | Maa et al. | 174/255 |
| 2003/0089923 | A1* | 5/2003 | Oida et al. | 257/200 |
| 2003/0186072 | A1* | 10/2003 | Soga et al. | 428/620 |
| 2003/0201310 | A1* | 10/2003 | Nakatsuka et al. | 228/207 |
| 2004/0097689 | A1* | 5/2004 | Tang | 528/87 |
| 2004/0149681 | A1* | 8/2004 | Maa et al. | 216/13 |
| 2004/0253474 | A1* | 12/2004 | Akamatsu et al. | 428/615 |
| 2004/0262779 | A1* | 12/2004 | Amagai et al. | 257/779 |
| 2005/0178002 | A1* | 8/2005 | Maeno | 29/840 |
| 2006/0038264 | A1* | 2/2006 | Ishimoto | 257/668 |
| 2006/0239855 | A1* | 10/2006 | Nakatsuka et al. | 420/560 |
| 2007/0099123 | A1* | 5/2007 | Tseng et al. | 430/311 |
| 2007/0240900 | A1* | 10/2007 | Yokomaku | 174/262 |
| 2008/0062665 | A1* | 3/2008 | Nakatsuka et al. | 361/768 |
| 2008/0066955 | A1 | 3/2008 | Nodo et al. | |
| 2008/0067699 | A1* | 3/2008 | Tamaki | 257/787 |
| 2008/0179379 | A1* | 7/2008 | Akamatsu et al. | 228/56.3 |
| 2008/0261001 | A1* | 10/2008 | Nakatsuka et al. | 428/198 |
| 2008/0310133 | A1* | 12/2008 | Yoshida et al. | 361/777 |
| 2009/0233119 | A1* | 9/2009 | Lyon | 428/598 |
| 2009/0236137 | A1* | 9/2009 | Kaneda et al. | 174/262 |
| 2009/0272577 | A1* | 11/2009 | Shiomi et al. | 174/74 R |
| 2010/0295177 | A1* | 11/2010 | Ouchi | 257/737 |

FOREIGN PATENT DOCUMENTS

| | | |
|---|---|---|
| JP | 9-54335 | 2/1997 |
| JP | 97/43456 | 11/1997 |
| JP | 2001-358446 | 12/2001 |
| JP | 2008-72065 | 3/2008 |
| WO | 97/43456 | 11/1997 |

* cited by examiner

MOUNTING STRUCTURE AND MOTOR

TECHNICAL FIELD

The present invention relates to a mounting structure in which an electronic component is surface-mounted with solder to a wiring substrate. The invention also relates to a motor including such a mounting structure.

BACKGROUND ART

In mounting structures in which an electronic component is surface-mounted to a wiring substrate, the heat resistance of the electronic component itself has been improved, but the overall heat resistance, in particular, durability to withstand repeatedly applied thermal shock, of the mounting structures including solder cannot yet be considered as sufficient. With the improvement of the functions of automobiles, there is a need to realize a motor that includes a mounting structure and can be used in the engine compartment of an automobile or its vicinity, including, for example, a motor for driving valves such as a slot valve and an inlet valve. To realize this, it is necessary that no cracks occur in solder joint portions of the mounting structure, after performing a thermal shock test designed assuming the use in the engine compartment, namely, a 1000-cycle thermal shock test from −40 to 150° C. It is also necessary that lead-free solder is used in order to reduce the environmental load.

Patent Literature 1 describes Sn—Ag—Bi—In-based lead-free solder that has excellent mechanical properties and can be used for substrate mounting.

Patent Literature 2 states that a land to which the electrode of an electronic component is connected via solder, and a wiring pattern formed in a substrate are connected with wiring having a narrow width, in order to prevent cracks from occurring in solder due to heat stress.

Patent Literature 3 describes a mounting structure using Sn—Cu-based or Sn—Ag-based lead-free solder. The literature states that a metal core substrate with excellent thermal conductivity and a ceramic substrate with excellent heat resistance can be used as a substrate.

CITATION LIST

Patent Document

Patent Document 1: JP H8-206874A
Patent Document 2: JP 2008-072065A
Patent Document 3: JP 2001-358446A

SUMMARY OF INVENTION

Problem to be Solved by the Invention

However, Patent Literature 1 describes only an improvement of mechanical properties at normal temperature, and does not describe the thermal environment in which the solder can be used. In fact, there is a problem in that when a 1000-cycle thermal shock test from −40 to 150° C., which is designed assuming the use in the vicinity of the engine of an automobile, is performed, cracks occur in the portion of the solder where it is joined with the electronic component, depending on the composition of the Sn—Ag—Bi—In-based solder and the properties of the wiring substrate.

Also, in the case of using the method described in Patent Literature 2, it is difficult to withstand thermal shock during the 1000-cycle thermal shock test from −40 to 150° C., unless the composition of the solder is selected appropriately.

Furthermore, in the case of using the Sn—Cu-based solder, which has poor wettability, or the Sn—Ag-based solder, which has low strength, that are disclosed in Patent Literature 3, the stress applied to the solder during the 1000-cycle thermal shock test from −40 to 150° C. cannot be reduced. Therefore it is difficult to prevent cracks from occurring in solder joint portions. Additionally, metal core substrates and ceramic substrates are very expensive.

The present invention solves the above-described conventional problems, and it is an object of the invention to provide, with the use of lead-five solder, a mounting structure in which an electronic component is surface-mounted to a wiring substrate, wherein no cracks occur in a solder joint portion after a 1000-cycle thermal shock test from −40 to 150° C. is performed. It is another object of the present invention to provide a motor including such a mounting structure.

Means for Solving Problem

A mounting structure according to the present invention is a mounting structure in which an electronic component is surface-mounted with Sn—Ag—Bi—In-based solder to a wiring substrate, the Sn—Ag—Bi—In-based solder comprising 0.1% by weight or more and 5% by weight or less of Bi, and more than 3% by weight and less than 9% by weight of In, the balance being made up of Sn, Ag and unavoidable impurities, the wiring substrate having a coefficient of linear expansion of 13 ppm/K or less in all directions.

A motor according to the present invention includes the above-described mounting structure of the present invention.

Effects of the Invention

According to the present invention, it is possible to provide a mounting structure exhibiting excellent thermal shock resistance and in which no cracks occur in a solder joint portion due to a 1000-cycle thermal shock test from −40 to 150° C. Furthermore, since the Sn—Ag—Bi—In-based solder is lead-free, it has low environmental load.

DESCRIPTION OF THE INVENTION

It is preferable that in the above-described mounting structure of the present invention, the Sn—Ag—Bi—In-based solder contains 0.1% by weight or more and 5% by weight or less of Ag. When the Ag content is smaller than this, the melting point of the solder rises, and the wettability and the flowability of the solder decrease. When the Ag content is larger than this, the melting point of the solder also rises, and the cost of the solder increases.

It is preferable that the above-mentioned wiring substrate is an FR-5 grade wiring substrate. An FR-5 grade wiring substrate is a glass epoxy substrate having heat resistance. Since the wiring substrate is an FR-5 grade wiring substrate, a wiring substrate that satisfies the condition that the coefficient of linear expansion is 13 ppm/K or less in all directions can be acquired at a low cost.

It is preferable that the above-mentioned wiring substrate has a glass transition temperature of 150° C. or more. This reduces deformation and warping in the wiring substrate under a high temperature environment, thus enabling the possibility of cracks occurring in the solder to be reduced.

It is preferable that the above-mentioned wiring substrate includes a solder resist formed by screen printing on its surface. This can prevent the thickness of the solder resist from increasing more than necessary. Accordingly, the deformation and warping in the wiring substrate during temperature change are reduced, thus enabling the possibility of cracks occurring in the solder to be reduced.

It is preferable that the above-mentioned electronic component has a size of 5750 or less. By using such a small electronic component, the difference in linear expansion between the wiring substrate and the electronic component during temperature change is reduced, thus enabling the possibility of cracks occurring in the solder to be reduced.

Hereinafter, preferred embodiments and examples of the present invention will be described with reference to the drawings. However, it should be appreciated that the present invention is not limited to the following embodiments and examples, and can be modified appropriately.

Figure 1:
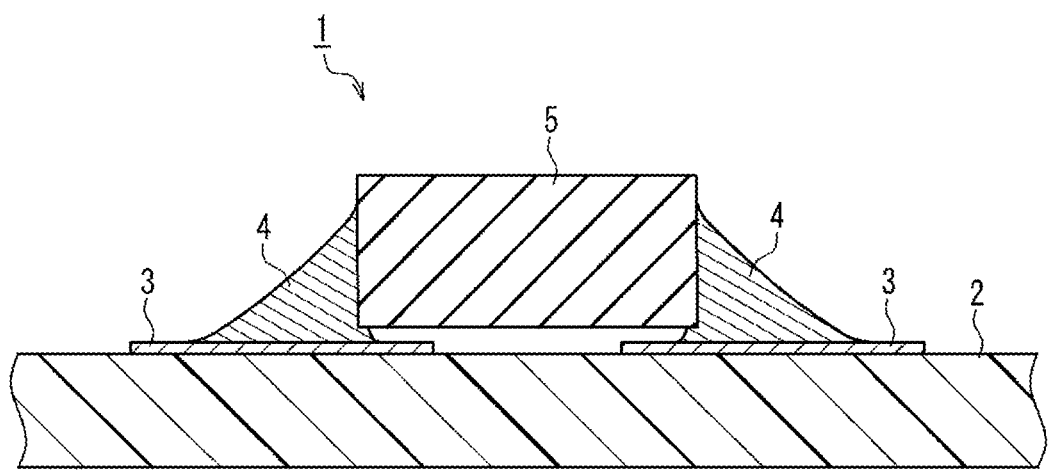
FIG. 1 is a cross-sectional view showing the outline of the configuration of an exemplary mounting structure according to the present invention.

FIG. 1 is a cross-sectional view showing the outline of the configuration of an exemplary mounting structure 1 according to the present invention. An electronic component 5 is surface-mounted with solder 4 onto wiring 3 that is formed in a predetermined pattern on a wiring substrate 2. Note that a solder resist described below has been omitted in FIG. 1.

—Solder—

The solder 4 will now be described.

The solder 4 is Sn—Ag—Bi—In-based solder containing 0.1% by weight or more and 5% by weight or less of Bi, and more than 3% by weight and less than 9% by weight of In, with the balance being made up of Sn, Ag and unavoidable impurities. This Sn—Ag—Bi—In-based solder is an environmentally friendly, lead-free composition.

Bi contributes to a decrease of the melting point and an improvement of the mechanical strength of the solder. However, when the Bi content exceeds the above numerical range (in particular, 10% by weight or more), there may be cases where a solder defect called a fillet-lifting (or lift-off) phenomenon resulting from the segregation of solder or the like occurs.

In also contributes to a decrease of the melting point and an improvement of the mechanical strength of the solder. However, when the In content exceeds the above numerical range, the melting point of the solder decreases so much that the mounting structure cannot be used in a high temperature environment. This also results in an increase in the cost of the solder.

Ag contributes to a decrease of the melting point of the solder and an improvement of the wettability and the flowability of the solder. The eutectic point is present when Ag is 3.5% by weight, and if the Ag content is far larger than this, then the melting point of the solder rises. Furthermore, an increased Ag content results in a rise in the solder cost. Therefore, the Ag content is preferably 0.1 to 5% by weight.

Figure 2A:
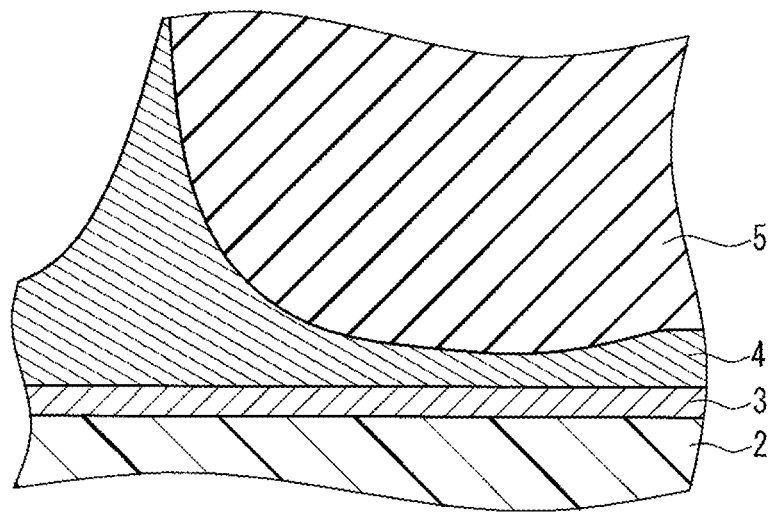
FIG. 2A is a cross-sectional view schematically showing the vicinity of a solder joint portion of a mounting structure according to an example of the present invention, taken after performing a 1000-cycle thermal shock test from −40 to 150° C.

An example of the present invention will now be given. As the wiring substrate 2, an FR-5 grade glass epoxy substrate was used that had coefficients of linear expansion of 11 ppm/K in the machine direction and 13 ppm/K in the transverse direction, a glass transition temperature of 180° C., and a solder resist film formed by screen printing on its surface. A capacitor of a size of 5750 was used as the electronic component 5. Sn—Ag—Bi—In-based solder containing 3.5% by weight of Ag, 0.6% by weight of Bi, and 6% by weight of In, with the balance being Sn and unavoidable impurities (hereinafter, referred to as "Sn-3.5 Ag-0.6 Bi-6 In"), was used as the Sn—Ag—Bi—In-based solder 4. Cream solder containing the Sn-3.5 Ag-0.6 Bi-6 In solder was printed onto the above wiring substrate 2 on which a predetermined pattern of wiring 3 formed of copper foil had been formed, the above electronic component 5 then was mounted on the cream solder, and the electronic component 5 was surface-mounted by reflowing, thus obtaining a mounting structure 1. The mounting structure 1 was subjected to a thermal shock cycle test in which a cycle of holding the mounting structure 1 at −40° C. for 30 minutes and subsequently holding it at 150° C. for 30 minutes was repeated 1000 times ("1000-cycle thermal shock test from −40 to 150° C."). FIG. 2A is a cross-sectional view schematically showing a state of the vicinity of a solder joint portion of the mounting structure 1 according to the above example, taken after performing the 1000-cycle thermal shock test from −40 to 150° C. In FIG. 2A, the same constituent elements as in FIG. 1 are denoted by identical reference numerals.

Figure 2B:
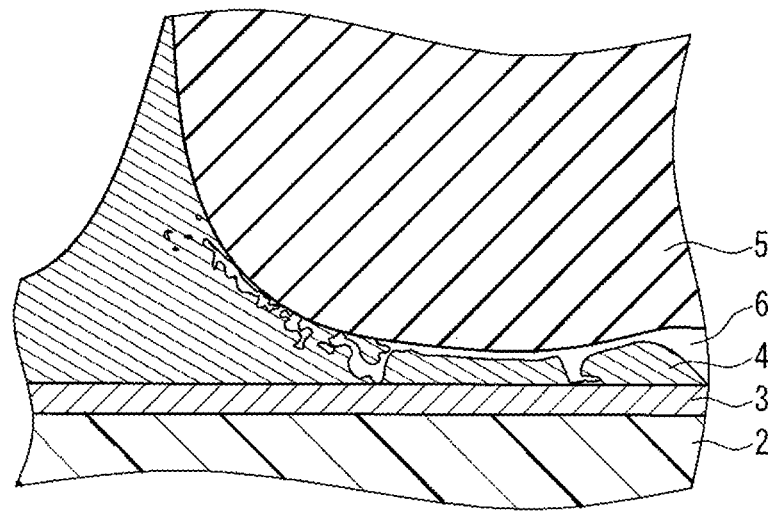
FIG. 2B is a cross-sectional view schematically showing the vicinity of a solder joint portion of a conventional mounting structure, taken after performing a 1000-cycle thermal shock test from −40 to 150° C.

As a conventional example, a mounting structure was obtained in the same manner as in the above example, except for using, as the solder, Sn—Ag—Cu-based solder containing 3.0% by weight of Ag, 0.5% by weight of Cu, with the balance being Sn and unavoidable impurities (hereinafter, referred to as "Sn-3.0 Ag-0.5 Cu"). This mounting structure was subjected to the same 1000-cycle thermal shock test from −40 to 150° C. as in the above example. FIG. 2B is a cross-sectional view schematically showing a state of the vicinity of a solder joint portion of the mounting structure according to the conventional example, taken after performing the 1000-cycle thermal shock test from −40 to 150° C. In FIG. 2B, the same constituent elements as in FIG. 1 are denoted by identical reference numerals.

In the case of the conventional example shown in FIG. 2B, a crack 6 was formed in the vicinity of the portion of the solder 4 where it was joined with the electronic component 5. In contrast, in the case of the example of the present invention shown in FIG. 2A, no cracks were observed in the solder 4. Thus, the mounting structure of the present invention exhibited excellent thermal shock resistance.

Table 1 shows the physical properties of four typical types of environmentally friendly, lead-free solder in comparison. In Table 1, "Sn-16.75 In" denotes Sn—In-based solder containing 16.75% by weight of In, with the balance being Sn and unavoidable impurities, and "Sn-3.9 Ag-0.6 Cu-3 Sb" denotes Sn—Ag—Cu—Sb-based solder containing 3.9% by weight of Ag, 0.6% by weight of Cu, and 3% by weight of Sb, with the balance being Sn and unavoidable impurities.

TABLE 1

| Solder composition | Melting point (° C.) | Tensile strength (MPa) |
|---|---|---|
| Sn—3.5Ag—0.6Bi—6In | 211 | 54 |
| Sn—16.75In | 205 | 38 |
| Sn—3.9Ag—0.6Cu—3Sb | 220 | 70 |
| Sn—3.0Ag—0.5Cu | 220 | 43 |

Table 2 shows the evaluation results for the thermal shock resistance of mounting structures using the various types of solder shown Table 1. The evaluation was performed in the following manner. Mounting structures were fabricated in the same manner as in the above example, except for using various types of solder, the 1000-cycle thermal shock test from −40 to 150° C. was then performed, and each of the mounting structures was cut for determination of whether there were any cracks in the solder joint portion. The mounting structures in which no cracks occurred were evaluated as "O" (good), and the mounting structures in which a crack occurred were evaluated as "X" (poor). As the electronic components mounted, capacitors and resistors with varying sizes were used.

TABLE 2

| | Electronic Component | | | | | | | |
|---|---|---|---|---|---|---|---|---|
| | Capacitor | | | | | | Resistor | |
| Solder Composition | 1005 | 1608 | 2012 | 3216 | 4532 | 5750 | 1608 | 2012 |
| Sn—3.5 Ag—0.6 Bi—6 In | O | O | O | O | O | O | O | O |
| Sn—16.75 In | X | X | X | X | X | X | X | X |
| Sn—3.9 Ag—0.6 Cu—3 Sb | O | O | O | O | X | X | O | O |
| Sn—3.0 Ag—0.5 Cu | O | X | X | X | X | X | X | X |

In general, it is desirable for solder to have a low melting point and good wettability, and also have increased mechanical strength.

As shown in Table 1, the Sn-16.75 In solder, which is a typical example of the Sn—In-based solder; has a low melting point, but has low tensile strength. Accordingly, as shown in Table 2, the solder could not withstand the thermal shock during the 1000-cycle thermal shock test from −40 to 150° C., and cracks occurred in the solder, regardless of the type and the size of the electronic components.

As shown in Table 1, the Sn-3.9 Ag-0.6 Cu-3 Sb solder, which is a typical example of the Sn—Ag—Cu—Sb-based solder, has high tensile strength, but has a high melting point of 220° C. and hence poor wettability. With such a degree of high melting point, it is supposedly possible to manage to reflow the solder to surface-mount the electronic components. However, the solder became too hard since Sb was homogeneously dissolved in the Sn matrix, and, as shown in Table 2, cracks occurred in the solder or the electronic components themselves were damaged after performing the 1000-cycle thermal shock test from −40 to 150° C., in the case of using relatively large electronic components with a size of 4532 or more.

The Sn-3.0 Ag-0.5 Cu solder, which is a typical example of the Sn—Ag—Cu-based solder, is the solder used in the above-described conventional example, and has a high melting point of 220° C. and hence poor wettability, and also has low tensile strength, as shown in Table 1. Accordingly, as shown in Table 2, cracks occurred in the solder after performing the 1000-cycle thermal shock test from −40 to 150° C., except for the case where a very small electronic component with a size of 1005 was used.

As shown in Table 1, the Sn-3.5 Ag-0.6 Bi-6 In solder, which is an example of the Sn—Ag—Bi—In-based solder according to the present invention, has a low melting point of 211° C. and hence good wettability, and can be reflowed at a temperature of 220° C. or lower. Furthermore, the solder has high tensile strength. Accordingly, as shown in Table 2, no cracks occurred after performing the 1000-cycle thermal shock test from −40 to 150° C., regardless of the type and the size of the electronic components.

Thus, the Sn—Ag—Bi—In-based solder including the composition of the present invention is well-balanced in the melting point and the tensile strength, as compared with the other types of solder shown in Table 1. Accordingly, forming a mounting structure by combination with an appropriate wiring substrate described below can realize a mounting structure that exhibits excellent thermal shock resistance and can withstand thermal shock sufficiently when used, for example, in the engine compartment in an automobile.

Table 3 shows the evaluation results for the thermal shock resistance of mounting structures using three types of Sn—Ag—Bi—In-based solder with varying In contents. The method of evaluation was the same as described with regard to Table 2. As the electronic components mounted, capacitors with varying sizes were used. In Table 3, the evaluation results for the Sn-3.5 Ag-0.6 Bi-6 In solder overlap with part of the evaluation results shown in Table 2.

TABLE 3

| | Electronic Component | | | | | |
|---|---|---|---|---|---|---|
| | Capacitor | | | | | |
| Solder composition | 1005 | 1608 | 2012 | 3216 | 4532 | 5750 |
| Sn—3.5 Ag—0.6 Bi—6 In | O | O | O | O | O | O |
| Sn—3.5 Ag—0.6 Bi—3 In | O | O | O | O | X | X |
| Sn—3.5 Ag—0.6 Bi—9 In | O | O | O | O | X | X |

As shown in Table 3, when the Sn-3.5 Ag-0.6 Bi-3 In solder, in which the In content is 3% by weight, and the Sn-3.5 Ag-0.6 Bi-9 In solder, in which the In content is 9% by weight, are used, cracks occurred in the solder in the case of using a relatively large electronic component with a size of 4532 or more. Therefore, it is necessary that the In content is more than 3% by weight and less than 9% by weight.

Note that experiments have confirmed that cracks occur in the solder in the 1000-cycle thermal shock test from −40 to 150° C. when the Bi content falls outside the above-described numerical range, and that soldering by reflow tends to be slightly difficult when the Ag content fall outside the above-described numerical range.

—Wiring Substrate—

In the following, the wiring substrate 2 constituting the mounting structure 1 of the present invention will be described.

Referring to FIG. 1, when there is a large difference in the coefficient of expansion between the wiring substrate 2 and the electronic component 5, stress repeatedly is applied to the solder 4 due to the 1000-cycle thermal shock test from −40 to 150° C. Accordingly, even if the solder 4 has high tensile strength, there is the possibility that cracks occur in the solder 4. Therefore, it is preferable that the wiring substrate 2 has a coefficient of linear expansion as close as possible to the coefficient of linear expansion of the electronic component 5. In general, the coefficient of linear expansion of the electronic component 5 used for surface mounting is about 7 ppm/K, for example. Therefore, the coefficient of linear expansion of the wiring substrate 2 of the present invention is 13 ppm/K or less in all directions. This improves the thermal shock resistance, thus making it possible to prevent cracks from occurring in the solder 4.

Table 4 shows the results of evaluating the thermal shock resistance of a mounting structure using, as the wiring substrate 2, an FR-4 grade wiring substrate (with coefficients of linear expansion of 15 ppm/K in the machine direction and 17 ppm/K in the transverse direction, and a glass transition temperature of 140° C.), and a mounting structure using, as the wiring substrate 2, the same FR-5 grade wiring substrate as used in the above example. The method of evaluation was the same as described with regard to Table 2. As the electronic components mounted, capacitors with varying sizes were used. In Table 4, the evaluation results for the case where the FR-5 grade wiring substrate was used overlap with part of the evaluation results shown in Table 2.

TABLE 4

| | Wiring substrate | | | | | | | |
|---|---|---|---|---|---|---|---|---|
| | FR-4 | | | | FR-5 | | | |
| | Electronic Component | | | | | | | |
| | Capacitor | | | | Capacitor | | | |
| Solder composition | 1005 | 1608 | 2012 | 3216 | 1005 | 1608 | 2012 | 3216 |
| Sn—3.5 Ag—0.6 Bi—6 In | X | X | X | X | ◯ | ◯ | ◯ | ◯ |
| Sn—16.75 In | X | X | X | X | X | X | X | X |
| Sn—3.9 Ag—0.6 Cu—3 Sb | X | X | X | X | ◯ | ◯ | ◯ | ◯ |
| Sn—3.0 Ag—0.5 Cu | X | X | X | X | ◯ | X | X | X |

As can be seen from Table 4, when the FR-4 grade wiring substrate, which has a coefficient of linear expansion exceeding 13 ppm/K in every direction, was used, cracks occurred in the solder, regardless of the solder composition. This indicates that due to a large difference in the coefficient of expansion between the wiring substrate 2 and the electronic component 5, the solder 4 cannot withstand the stress generated by thermal shock, even if it has high tensile strength.

For example, a ceramic substrate is known as a wiring substrate that satisfies the above-described condition regarding the coefficient of linear expansion. However, a ceramic substrate is very expensive and lacks practicality. Therefore, a glass epoxy substrate is preferred as the wiring substrate 2 in that it is inexpensive and can be readily available in the market.

It is preferable that the wiring substrate 2 is an FR-5 grade wiring substrate. FR-5 grade wiring substrates are glass epoxy substrates having heat resistance, and many of them satisfy the above-described condition regarding the coefficient of linear expansion, and also are inexpensive.

Furthermore, it is preferable that the glass transition temperature (Tg) of the wiring substrate 2 is 150° C. or more. Considering the use in the engine compartment of an automobile, the upper limit for the environmental temperature is approximately 150° C., and the heat resistance temperature required for an electronic component used in the engine compartment of an automobile often is set to 150° C. When the glass transition temperature of the wiring substrate 2 is less than 150° C., there is the possibility that increased deformation and warping will occur in the wiring substrate 2 under the high temperature environment imposed by the 1000-cycle thermal shock test from −40 to 150° C., and excessive stress will be exerted on the solder 4, thus causing cracks. Many of the FR-5 grade wiring substrates have a glass transition temperature of 150° C. or more.

In general, a solder resist often is formed on the surface of a wiring substrate on which wiring is formed. A solder resist is formed in order to expose the portion of the wiring that needs to be soldered, thus preventing the solder from attaching to the area that need not be soldered. In some cases, a solder resist is also formed with an expectation of achieving its function as a moisture-proof coating film for protecting the wiring substrate against moisture. Such a solder resist is made of, for example, a resin composition containing a thermosetting epoxy resin as its main component and optionally containing an additive such as an acrylic resin. According to the present invention, in the case of forming a solder resist on the wiring substrate 2, it is preferable that the solder resist is formed by screen printing. The reason for this will be described with reference to FIGS. 3A and 3B.

Figure 3A:
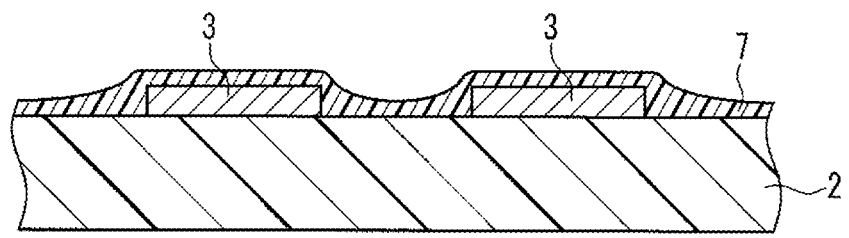
FIG. 3A is a cross-sectional view conceptually illustrating a solder resist formed on a wiring substrate by screen printing.

FIG. 3A is a cross-sectional view conceptually illustrating a solder resist 7 formed on the wiring substrate 2 by screen printing. For example, when 105 μm-thick wiring 3 made of copper foil is formed on the surface of the wiring substrate 2, a 90 μm-thick solder resist 7, which has a smaller thickness than the wiring 3, can be formed in the case of using screen printing.

Figure 3B:
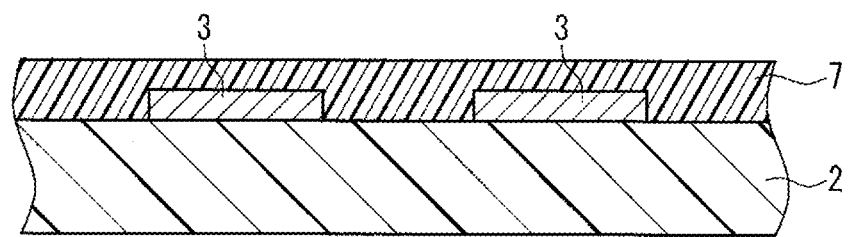
FIG. 3B is a cross-sectional view conceptually illustrating a solder resist formed on a wiring substrate by curtain coating.

Curtain coating is known as a method for forming a solder resist. FIG. 3B is a cross-sectional view conceptually illustrating a solder resist 7 formed on the wiring substrate 2 by curtain coating. In the case of using curtain coating, the thickness of the solder resist 7 is larger than in the case of using screen printing. For example, when a 105 μm-thick wiring 3 made of copper foil is formed on the surface of the wiring substrate 2, a solder resist 7 having a larger thickness than the wiring 3 is formed in the case of using curtain coating.

When an electronic component is surface-mounted to the wiring substrate 2, part of the surface layer of the solder resist 7 is removed prior thereto so that the wiring 3 is exposed. The thickness of the solder resist 7 remaining in the area where the wiring 3 is not formed after part of the solder resist 7 has been removed also tends to be larger in the case of forming the solder resist 7 by curtain coating (FIG. 3B) than in the case of forming it by screen printing (FIG. 3A).

Although depending on the composition, the solder resist 7 has a coefficient of linear expansion of, for example, about 130 ppm/K, and this is significantly different from the coefficient of linear expansion of the wiring substrate 2. Accordingly, under a rapid temperature change such as a 1000-cycle thermal shock test from −40 to 150° C., there is the possibility that deformation and warping will occur in the wiring substrate 2 due to the difference in linear expansion between the solder resist 7 and the wiring substrate 2, and excessive stress is exerted on the solder 4, thus causing cracks. The smaller the thickness of the solder resist 7 is, the lesser the deformation and warping of the wiring substrate 2 due to temperature change. Accordingly, forming the solder resist 7 by screen printing, which can form a solder resist 7 having a smaller thickness, enables a further reduction of cracks in the solder 4, and a further improvement in the thermal shock resistance of the mounting structure.

—Electronic Component—

In the following, the electronic component 5 will be described.

There is no particular limitation with respect to the electronic component 5 used for the mounting structure of the present invention, as long as it can be surface-mounted with the solder 4 to the wiring substrate 2.

Since one of the causes of cracks occurring in the solder 4 due to thermal shock is a difference in linear expansion between the wiring substrate 2 and the electronic component 5, it is preferable that the size of the electronic component 5 is small. Also, the smaller the size of an electronic component 5 is, the smaller the size of a mounting structure containing the electronic component 5 can be. From these viewpoints, it is preferable that the size of the electronic component 5 is 5750 or less. In general, there has been a need for a small, high-output mounting structure in recent years; for example, an electronic component of a size of 4532 or 5750 often is used for the control circuit of a motor.

According to the present invention, an electronic component of a size larger than 5750 (for example, 7563 size) also can be used. However, the difference in linear expansion between the electronic component 5 and the wiring substrate 2 due to thermal shock increases with an increase in the size of the electronic component 5, so that the possibility of the occurrence of cracks in the solder 4 increases. In such a case, it is preferable that the solder 4 is appropriately reinforced, for example, with a solder mound or the like, as needed.

Although capacitors and resistors are shown as examples of the types of the electronic component 5 in the above description, the present invention is not limited thereto, and electronic components other than these can be used.

—Motor—

An exemplary motor 10 to which a mounting structure of the present invention is mounted will be described with reference to FIG. 4.

Figure 4:
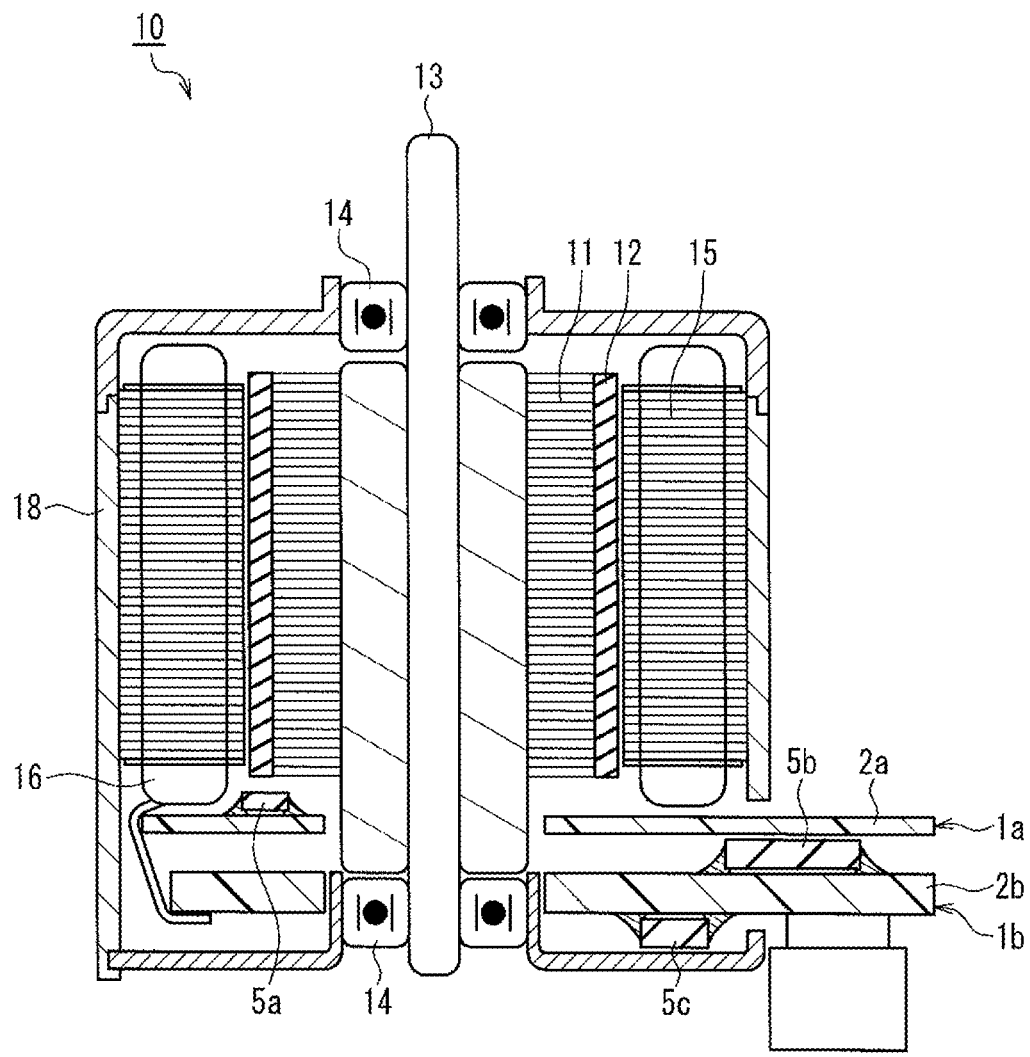
FIG. 4 is a cross-sectional view showing the outline of the configuration of an exemplary motor including a mounting structure of the present invention.

The motor shown in FIG. 4 is an inner rotor brushless DC motor in which a stator 15 is disposed around a rotor 11. A shaft 13 penetrating through the rotor 11 is supported rotatably by a pair of bearings 14. The rotor 11 retains a magnet 12. Mounting structures 1a and 1b for supplying electricity to a coil 16 wound around the core of the stator 15 and controlling the rotation of the rotor 11 are housed in a case 18 of the motor 10. The mounting structures 1a and 1b are formed by surface-mounting electronic components 5a, 5b and 5c on wiring substrates 2a and 2b.

The above-described mounting structure of the present invention can be used as the mounting structures 1a and 1b.

Since the mounting structure of the present invention exhibits excellent thermal shock resistance, no cracks will occur in the solder joint portions of the mounting structures 1a and 1b even if the motor 10 is disposed, for example, in the engine compartment of an automobile.

The motor 10 shown in FIG. 4 is merely an example, and a motor including the mounting structure of the present invention is not limited thereto. For example, the motor may be an outer rotor brushless DC motor, or may be a motor other than brushless DC motors. Further, the mounting structures may not need to be housed in the motor case, and may be disposed outside the case.

It should be appreciated that the mounting structure of the present invention also can be applied to uses other than for motors. For example, the mounting structure may be a mounting structure contained in various control apparatuses, car navigation systems, personal computers, various portable information terminals such as mobile phones and PDAs, and the like.

Each of the above-described embodiments and examples is intended merely to clarify the technical content of the present invention. The present invention is not to be construed as being limited to these specific examples, but is to be construed in a broad sense, and may be practiced with various modifications within the spirit and the scope of the claims.

INDUSTRIAL APPLICABILITY

Although there is no particular limitation with respect to the field of application of the present invention, the present invention preferably can be used, in particular, as a mounting structure used in an environment exposed to severe temperature changes. For example, the invention can be used in automobiles (particularly in the engine compartment thereof), various factories, power generation installations, and the like.

DESCRIPTION OF SYMBOLS

| | |
|---|---|
| 1, 1a and 1b | Mounting structure |
| 2, 2a and 2b | Wiring substrate |
| 3 | Wiring |
| 4 | Solder |
| 5, 5a, 5b, and 5c | Electronic component |
| 6 | Crack |
| 7 | Solder resist |
| 10 | Motor |
| 11 | Rotor |
| 12 | Magnet |
| 13 | Shaft |
| 14 | Bearing |
| 15 | Stator |
| 16 | Coil |
| 18 | Case |

The invention claimed is:

1. A mounting structure in which an electronic component is surface-mounted with Sn—Ag—Bi—In-based solder onto a wiring that is formed in a predetermined pattern on a wiring substrate, the Sn—Ag—Bi—In-based solder comprises 0.1% by weight or more and 5% by weight or less of Bi, and more than 3% by weight and less than 9% by weight of In, the balance being made up of Sn, Ag and unavoidable impurities, the wiring substrate has a coefficient of linear expansion of 13 ppm/K or less in all directions, a solder resist having a smaller thickness than the wiring is formed on the same surface of the wiring substrate on which the wiring is formed; and the solder resist is made of a resin composition containing a thermosetting epoxy resin as a main component and containing an acrylic resin as an additive.

2. The mounting structure according to claim 1, wherein the Sn—Ag—Bi—In-based solder comprises 0.1% by weight or more and 5% by weight or less of Ag.

3. The mounting structure according to claim 1, wherein the wiring substrate is an FR-5 grade wiring substrate, and the wiring substrate has a glass transition temperature of 150° C. or more.

4. The mounting structure according to claim 1, wherein the solder resist is formed by screen printing on the surface of the wiring substrate.

5. The mounting structure according to claim 1, wherein the electronic component has a size of 5750 or less.

6. A motor comprising the mounting structure according to claim 1.

* * * * *